US006812568B2

(12) United States Patent
Horikawa et al.

(10) Patent No.: US 6,812,568 B2
(45) Date of Patent: Nov. 2, 2004

(54) ELECTRODE STRUCTURE, AND METHOD FOR MANUFACTURING THIN-FILM STRUCTURE

(75) Inventors: Makio Horikawa, Tokyo (JP); Kiyoshi Ishibashi, Tokyo (JP); Mika Okumura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/381,213

(22) PCT Filed: Jul. 30, 2001

(86) PCT No.: PCT/JP01/06566

§ 371 (c)(1), (2), (4) Date: Mar. 28, 2003

(87) PCT Pub. No.: WO03/012859

PCT Pub. Date: Feb. 13, 2003

(65) Prior Publication Data

US 2003/0190817 A1 Oct. 9, 2003

(51) Int. Cl.[7] ................................................ H01L 23/48

(52) U.S. Cl. ....................... 257/736; 257/737; 257/750; 438/612; 438/613; 438/614

(58) Field of Search ................................ 257/736–737, 257/750, 756; 438/637, 612, 613, 614

(56) References Cited

U.S. PATENT DOCUMENTS 5,661,081 A * 8/1997 Hsue et al. ................. 438/106

FOREIGN PATENT DOCUMENTS

| | | | | |
|---|---|---|---|---|
| EP | 762510 | | 3/1997 | |
| JP | 57-088763 | | 6/1982 | |
| JP | 61-245549 | | 10/1986 | |
| JP | 63-161648 | | 7/1988 | |
| JP | 2-224336 | | 9/1990 | |
| JP | 02-224336 | * | 9/1990 | ......... H01L/21/321 |
| JP | 6-89893 | | 3/1994 | |
| JP | 7-297371 | | 11/1995 | |
| JP | 07-297371 | * | 11/1995 | ........... H01L/27/04 |
| JP | 8-78524 | | 3/1996 | |
| JP | 11-243214 | | 9/1999 | |

* cited by examiner

*Primary Examiner*—Hsien Ming Lee
(74) *Attorney, Agent, or Firm*—Oblon, Spivak, McClelland, Maier & Neustadt, P.C.

(57) ABSTRACT

A manufacturing method of an electrode structure and a thin-film structural body, which can remove a sacrifice film without removing other insulating films. An anchor hole which provides an opening to the surface of a wiring is covered with a sacrifice film and a nitride film. The anchor hole is constituted by a hole section formed in the nitride film and an opening of the sacrifice film. The hole section is opened to enter the wiring inward from an edge of the surface of the wiring by a first predetermined distance. The opening is opened to retreat from the hole section by a second predetermined distance. The existence of the first and second predetermined distances makes it possible to lengthen the entering distance to the oxide film of etchant to be used for removing the sacrifice film.

20 Claims, 9 Drawing Sheets

F I G. 1
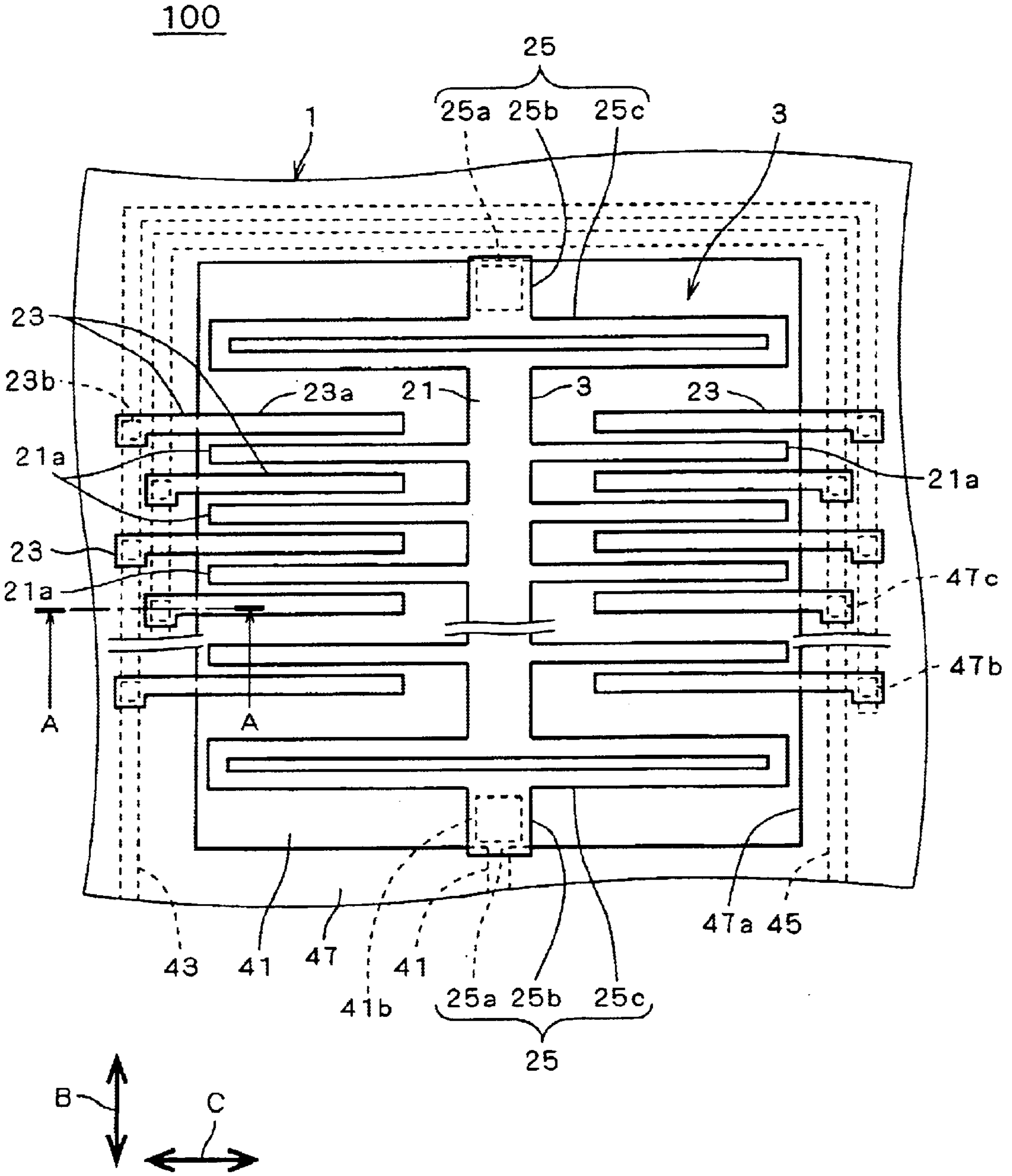

F/G. 7
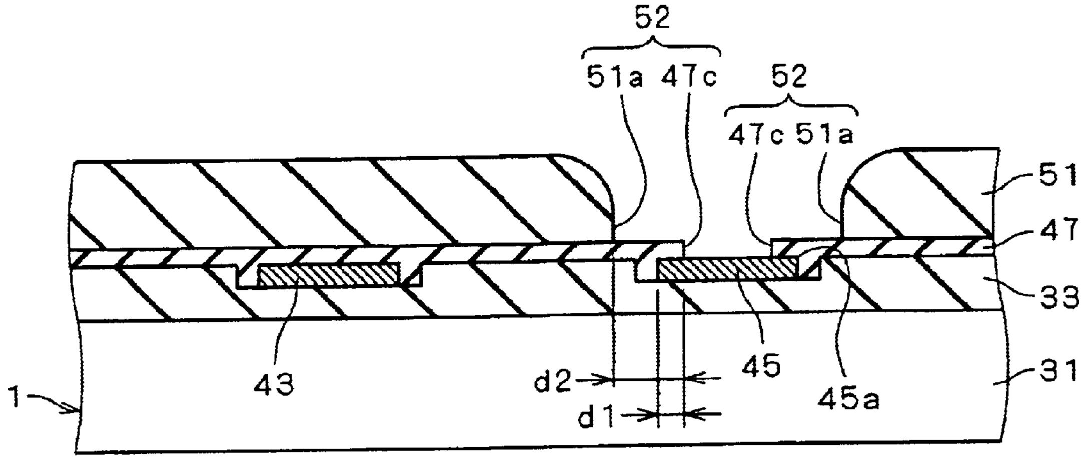
F/G. 8
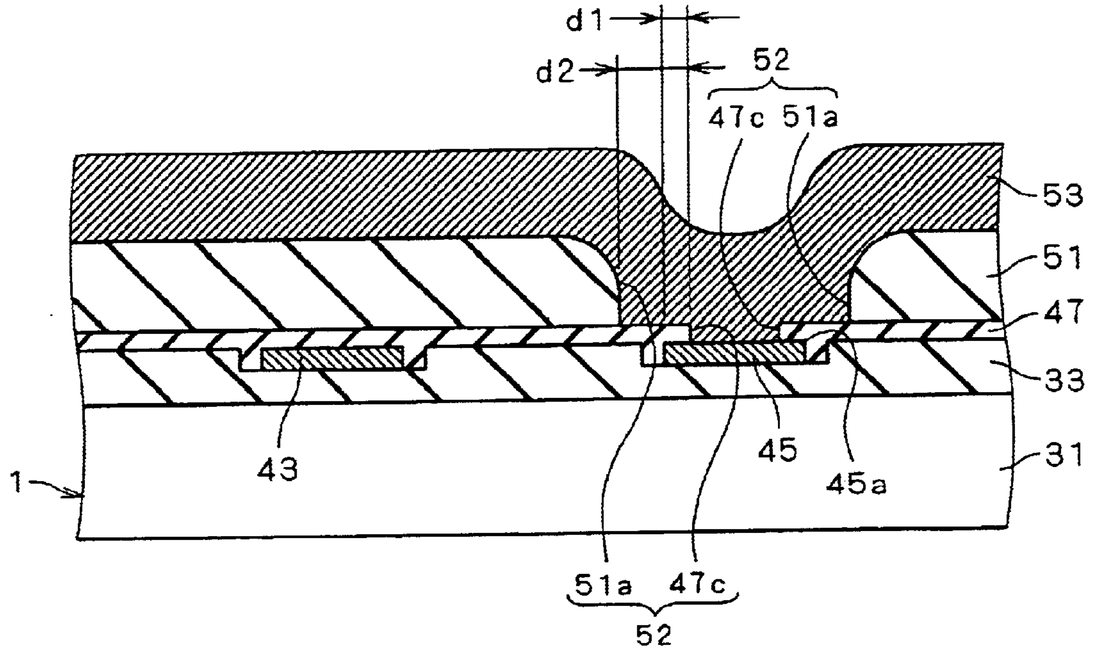

F I G. 9
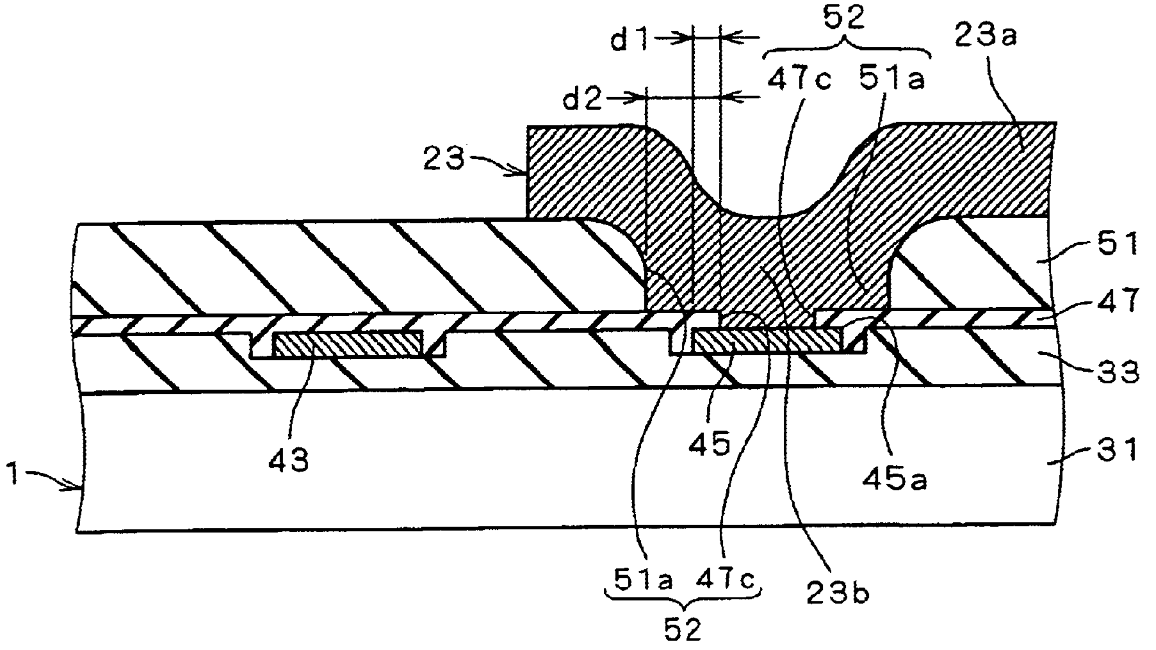
F I G. 10
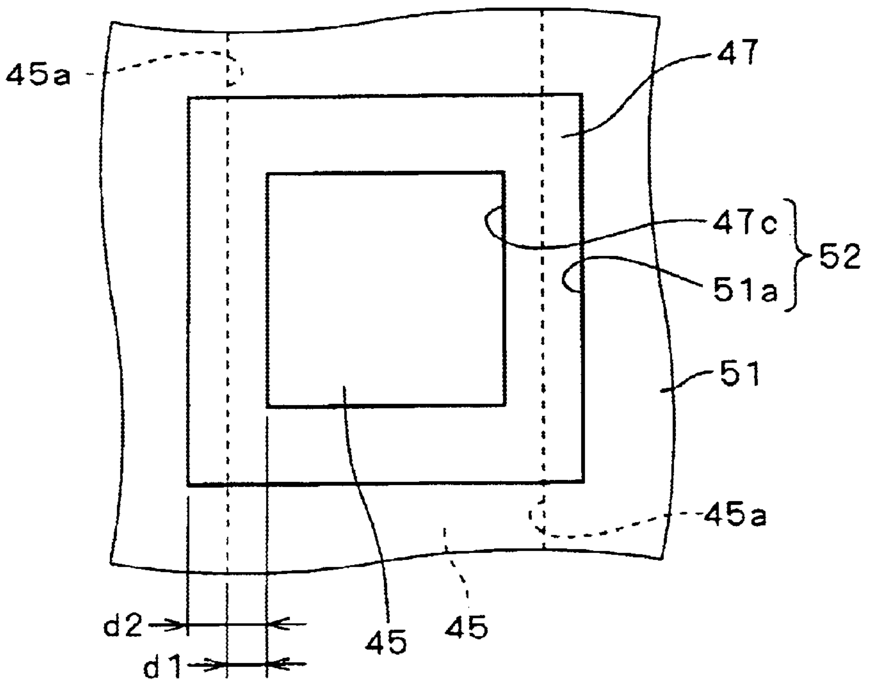

F I G. 13
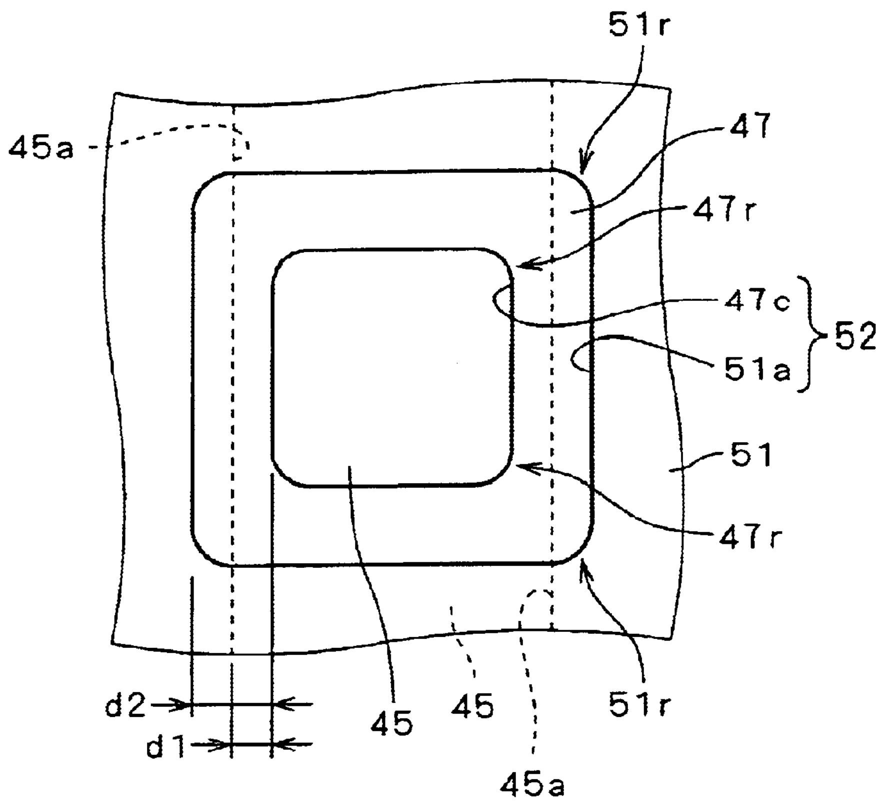

ELECTRODE STRUCTURE, AND METHOD FOR MANUFACTURING THIN-FILM STRUCTURE

TECHNICAL FIELD

The present invention relates to an electrode structure that is formed by using a semiconductor processing technique and a manufacturing method of a thin-film structural body.

BACKGROUND ART

FIG. 17 is a cross-sectional view showing a conventional electrode structure, which shows a thin-film structural body 101 installed in the electrode structure. The thin-film structural body 101 includes a supporting portion 103 and a floating portion 105 supported by the supporting portion 103, and is formed above a substrate 107 by using a conductive material. The floating portion 105, which is placed with a predetermined distance from the substrate 107, extends outwards from an upper portion of the supporting portion 103.

The substrate 107 includes a substrate main body 111, a first insulating film 113, a wiring 115 and a second insulating film 117. The first insulating film 113 is formed on the substrate main body 111. The wiring 115 is provided on the surface of the first insulating film 113, and the surface of the first insulating film 113 and the surface of the wiring 115 are substantially flattened without a step portion. The second insulating film 117 covers the surfaces of the wiring 115 and the first insulating film 113 and side faces thereof. Here, the second insulating film 117 has a hole section 117*a* which opens on the surface of the wiring 115 so that the surface of the wiring 115 is selectively exposed. The supporting portion 103 is formed on the wiring 115 through the hole section 117*a*.

FIGS. 14 to 16 are cross-sectional views showing a sequence of conventional manufacturing processes of a thin-film structural body. First, as shown in FIG. 14, a sacrifice film 121 is formed on the entire surface of the substrate 107. In this stage, the second insulating film 117 has no hole section 117*a* in the substrate 107.

Next, a dry etching process is carried out from the surface side of the sacrifice film 121 so that an opening 121*a* is formed in the sacrifice film 121 while a hole section 117*a* is formed in the second insulating film 117; thus, an anchor hole 122 is formed so that the surface of the wiring 115 is selectively exposed. Consequently, a structure shown in FIG. 15 is obtained.

Next, as shown in FIG. 16, a thin-film layer 123 is formed on the sacrifice film 121 and the substrate 107 exposed through the anchor hole 122 by using a conductive material.

Thereafter, the thin-film layer 123 is selectively removed, with the result that residual portions of the thin-film layer 123 thus patterned are allowed to form a thin-film structural body 101. Successively, the sacrifice film 121 is removed so that a structure shown in FIG. 17 is obtained. Among the residual portions of the thin-film layer 123, the portion fitted into the anchor hole 122 forms the supporting portion 103 and the portion located on the sacrifice film 121 forms the floating portion 105.

In such a conventional manufacturing method, the sacrifice film 121 is desirably formed by using a material which is easily removed by etching, and, for example, a silicon oxide film is employed. With respect to the substrate main body 111, a silicon substrate is employed so that a semiconductor processing technique capable of fine manufacturing processes can be applied thereto. Further, in order to easily form the first insulating film 113 on the silicon substrate, a silicon oxide film is also employed to the first insulating film 113 in the same manner as the sacrifice film 121.

In order to prevent the first insulating film 113 from being also etched upon etching the sacrifice film 121, a material which is less susceptible to etching for the silicon oxide film and is easily processed, such as a silicon nitride film, is employed as the second insulating film 117.

However, in the case where the second insulating film 117 allows the surface of the wiring 115 to be completely exposed, etchant used for etching the sacrifice film 121 tends to invade between the side face of the wiring 115 and the second insulating film 117 and reach the first insulating film 113.

FIG. 18 is a plan view showing the structure of FIG. 15 when viewed from the opening side of the anchor hole 122. In the case where the anchor hole 122 on a plan view has a rectangular shape, a square or the like, with acute corners 122*a* stresses tend to concentrate on these corners. For this reason, there is a high possibility that a crack generates from each of these corners into the sacrifice film 121, the first insulating film 113 and the second insulating film 117. In particular, in the case where a silicon nitride film is used to form the second insulating film 117, its residual stress is exerted in the stretching direction while the residual stresses in the sacrifice film 121 and the first insulating film 113, made of a silicon oxide film, are exerted in the compressing direction; therefore, it is considered that this structure is more susceptible to cracks. The generation of such cracks not only causes a problem with strength, but also results in a higher possibility of etchant for use in etching the sacrifice film 121 reaching the first insulating film 113.

DISCLOSURE OF THE INVENTION

An object of the present invention is to provide an electrode structure and a manufacturing method of a thin-film structural body, which can remove a sacrifice film without removing other insulating films. Moreover, another object of the present invention is to provide an electrode structure and a manufacturing method of a thin-film structural body, which can suppressing the generation of cracks.

In a first aspect of an electrode structure, the electrode structure includes: a wiring (45) selectively placed on a first insulating film (33); a second insulating film (47) covering the first insulating film, selectively covering the wiring, and having a hole section (47*c*), said hole section entering the wiring inward by a first predetermined distance (d1) from an edge (45*a*) of a surface of the wiring to selectively expose the surface of the wiring; a sacrifice film (51) having an opening (51*a*) selectively exposing the surface of the wiring, and selectively formed on at least the second insulating film; and a thin-film layer (53) made of conductive material connected to the surface of the wiring selectively exposed through the opening and the hole section.

According to the first aspect of the electrode structure, since the hole section covers the first predetermined distance from the edge of the surface of the wiring, the invading path into the first insulating film of etchant to be used for etching the sacrifice film is lengthened. This reduces the possibility of that the etchant reaches the first insulating film. Thus, even when the first insulating film and the sacrifice film are made of the same material, it is possible to reduce the possibility of the first insulating film being etched in the etching process of the sacrifice film.

A second aspect of the electrode structure according to the present invention is the first aspect of the electrode structure, and the hole section (47*c*) is filled with the thin-film layer (53).

According to the second aspect of the electrode structure, it is possible to effectively prevent the invasion of the etchant to be used for etching the sacrifice film.

A third aspect of the electrode structure according to the present invention is the second aspect of the electrode structure, and the opening (51*a*) is opened so as to retreat from the hole section (47*c*) by a second predetermined distance (d2).

According to the third aspect of the electrode structure, it is possible to make a portion supporting a floating structure of the thin-film layer thicker, and consequently to increase the strength of the structure.

A fourth aspect of the electrode structure according to the present invention is the third aspect of the electrode structure, and the opening (51*a*) is filled with the thin-film layer (53).

According to the fourth aspect of the electrode structure, it is possible to lengthen the invading path to the first insulating film of the etchant to be used for etching the sacrifice film.

A fifth aspect of the electrode structure according to the present invention is the first aspect of the electrode structure, and the hole section (47*c*) has a polygonal shape with rounded corners (47*r*) or an elliptic shape on a plan view.

According to the fifth aspect of the electrode structure, since there are no corners in a plane shape of the hole section, it is possible to avoid concentration of residual stresses, and consequently to suppress the generation of cracks.

A sixth aspect of the electrode structure according to the present invention is the first aspect of the electrode structure, and the opening (51*a*) has a polygonal shape with rounded corners (51*r*) or an elliptic shape on a plan view.

According to the sixth aspect of the electrode structure, since there are no corners in a plane shape of the opening, it is possible to avoid concentration of residual stresses, and consequently to suppress the generation of cracks.

A seventh aspect of the electrode structure according to the present invention includes: a wiring (45) selectively placed on a first insulating film (33); a second insulating film (47) covering the first insulating film, selectively covering the wiring, and having a hole section (47*c*), said hole section entering the wiring inward by a first predetermined distance (d1) from an edge (45*a*) of a surface of the wiring to selectively expose the surface of the wiring, a residual stress of which is different from a residual stress of the first insulating film in direction; and a conductive thin-film structural body having a supporting portion (23*b*) connected to the surface of the wiring selectively exposed through the hole section, and a floating portion (23*a*) supported by the supporting portion with a predetermined distance from the second insulating film.

According to the seventh aspect, since the hole section (47*c*) of the second insulating film, a residual stress of which is different from a residual stress of the first insulating film, is placed with the first predetermined distance from the edge 45*a* of the surface of the wiring, it is possible to reduce a shearing stress exerted between the two elements.

An eighth aspect of the electrode structure according to the present invention is the seventh aspect of the electrode structure, and the supporting portion (23*b*) covers the hole section (47*c*).

According to the eighth aspect of the electrode structure, since the supporting portion is connected to both of the second insulating film and the wiring formed on the first insulating film, it is possible to reduce the possibility of the first insulating film and the second insulating film separating from each other.

In the eighth structure of the electrode structure, for example, the residual stress of the first insulating film (33) is a compressive stress while the residual stress of the second insulating film is a tensile stress. Moreover, for example, the first insulating film (33) is an oxide film and the second insulating film is a nitride film.

A ninth aspect of the electrode structure according to the present invention is the seventh aspect of the electrode structure, and the hole section (47*c*) has a polygonal shape with rounded corners (47*r*) or an elliptic shape on a plan view.

According to the ninth aspect of the electrode structure, since there are no corners in a plane shape of the hole section, it is possible to avoid concentration of residual stresses, and consequently to suppress the generation of cracks.

A tenth aspect of the electrode structure according to the present invention is the seventh aspect of the electrode structure, and the opening (51*a*) has a polygonal shape with rounded corners (51*r*) or an elliptic shape on a plan view.

According to the tenth aspect of the electrode structure, since there are no corners in a plane shape of the opening, it is possible to avoid concentration of residual stresses, and consequently to suppress the generation of cracks.

According to the electrode structure of the present invention, the surface of the first insulating film and the surface of the wiring are preferably placed on the same plane.

A first aspect of a manufacturing method of a thin-film structural body according to the present invention includes the steps of: (a) selectively forming a wiring (45) on a first insulating film (33); (b) forming a second insulating film (47) on the wiring and the first insulating film; (c) selectively removing the second insulating film to form a hole section (47*c*) which enters the wiring inward from an edge (45*a*) of a surface of the wiring by a first predetermined distance (d1) so that the surface of the wiring (45) is selectively exposed; (d) forming a sacrifice film (51) on the second insulating film; (e) selectively removing the sacrifice film to form an opening (51*a*) exposing the surface of the wiring so that an anchor hole (52) is formed; (f) forming a thin-film layer (53) on the anchor hole and the sacrifice film with a conductive material; and (g) removing the sacrifice film by etching.

According to the first aspect of the manufacturing method of a thin-film structural body, since the hole section covers the first predetermined distance from the edge of the surface of the wiring, it is possible to lengthen the invading path into the first insulating film of etchant to be used for etching the sacrifice film. Thus, even when the first insulating film and the sacrifice film are made of the same material, it is possible to reduce the possibility of the first insulating film being etched in the etching process of the sacrifice film at step (g).

A second aspect of the manufacturing method of a thin-film structural body according to the present invention is the first aspect of the manufacturing method of a thin-film structural body, and the opening (51*a*) is opened so as to retreat from the hole section (47*c*) by a second predetermined distance (d2).

According to the second aspect of the manufacturing method of a thin-film structural body, it is possible to make a portion supporting a floating structure of the thin-film layer thicker, and consequently to increase the strength of the structure. Moreover, with an arrangement in which the anchor hole is filled with the thin-film layer at step (f), it is possible to lengthen the invading path to the first insulating film of etchant to be used for etching the sacrifice film.

A third aspect of the manufacturing method of a thin-film structural body according to the present invention is the first aspect of the manufacturing method of a thin-film structural body, and the hole section (47*c*) has a polygonal shape with rounded corners (47*r*) or an elliptic shape on a plan view.

According to the third aspect of the manufacturing method of a thin-film structural body, since there are no corners in a plane shape of the hole section, it is possible to avoid concentration of residual stresses, and consequently to suppress the generation of cracks.

A fourth aspect of the manufacturing method of a thin-film structural body according to the present invention is the first aspect of the manufacturing method of a thin-film structural body, and the opening (51*a*) has a polygonal shape with rounded corners (51*r*) or an elliptic shape on a plan view.

According to the fourth aspect of the manufacturing method of a thin-film structural body, since there are no corners in a plane shape of the opening, it is possible to avoid concentration of residual stresses, and consequently to suppress the generation of cracks.

In the manufacturing method of a thin-film structural body of the present invention, for example, the first insulating film (33) and the sacrifice film (51) are oxide films, and the second insulating film (47) is a nitride film.

In the manufacturing method of a thin-film structural body according to the present invention, a surface of the first insulating film and the surface of the wiring are preferably placed on a same plane.

These and other objects, features, aspects and advantages of the present invention will become more apparent in conjunction with the following detailed description and the accompanying drawings.

BRIEF DESCRIPTION OF THE DRAWINGS

FIGS. 3 to 9 are cross-sectional views showing manufacturing processes of the structure shown in FIG. 2;

FIGS. 10 to 13 are plan views showing the vicinity of an anchor hole;

FIG. 17 is a cross-sectional view showing a conventional electrode structure; and FIG. 18 is a plan view showing a conventional electrode structure.

BEST MODES FOR CARRYING OUT THE INVENTION

A. Embodiment 1

Figure 2:
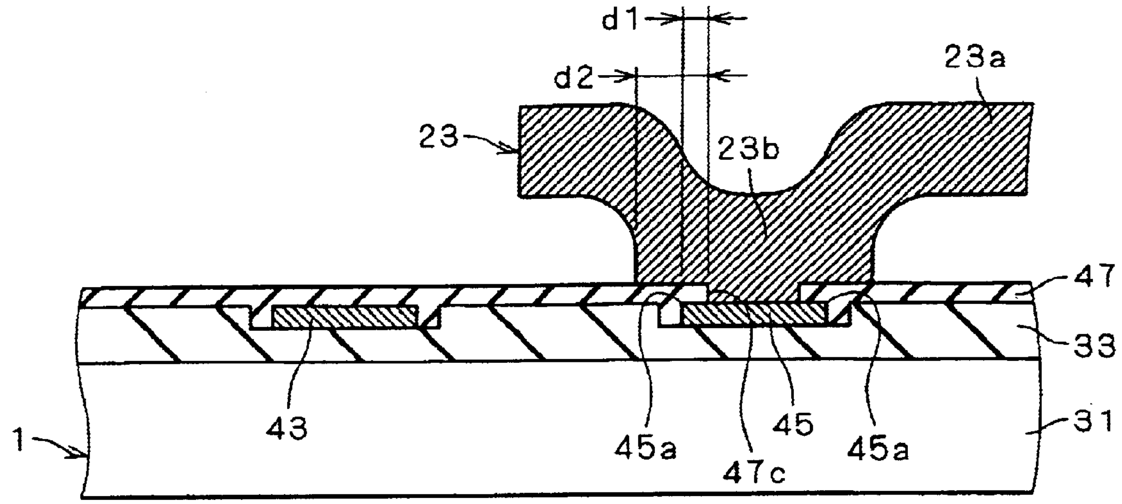
FIG. 2 is a cross-sectional view taken along line A—A of FIG. 1.
Figure 1:
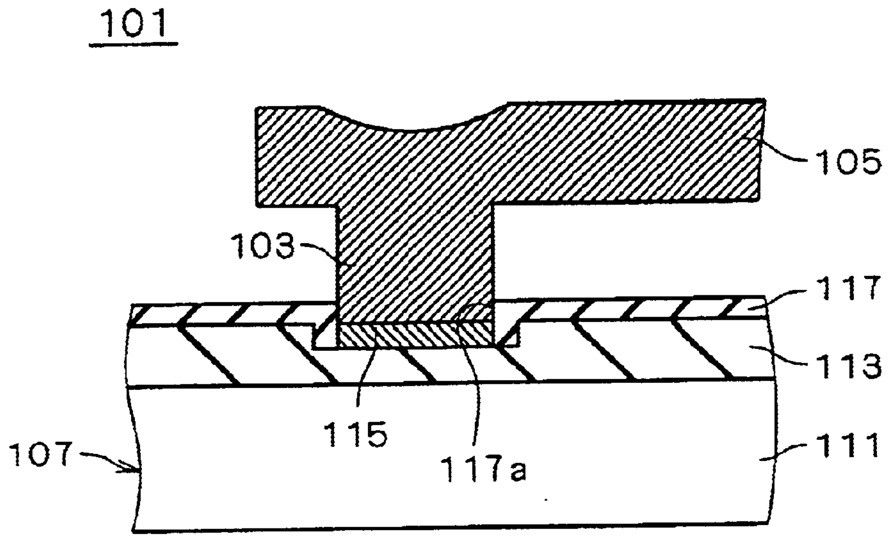
FIG. 1 is a plan view showing a configuration of a main part of a semiconductor acceleration sensor to which an electrode structure and a manufacturing method of a thin-film structural body according to the present invention can be applied.
Figure 1:
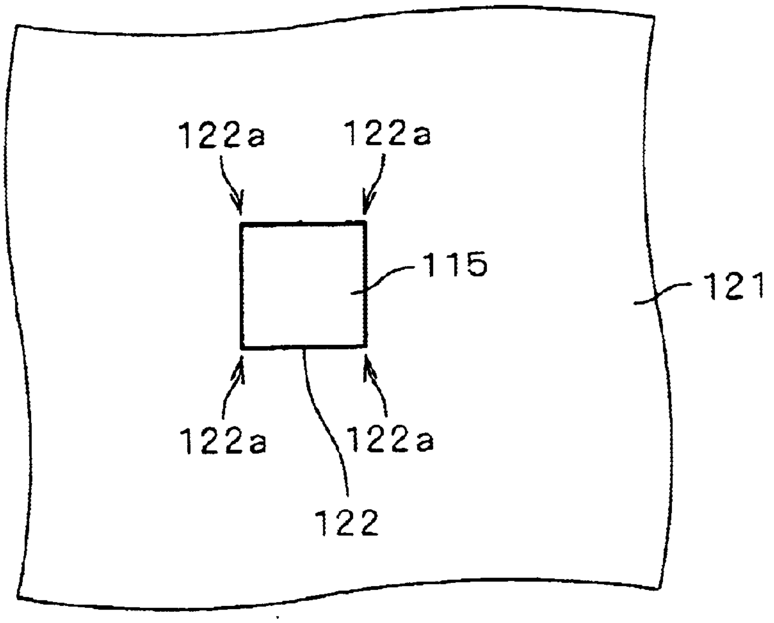

FIG. 1 is a plan view showing a configuration of a main part of a semiconductor acceleration sensor 100 to which a manufacturing method of a thin-film structural body according to the present invention can be applied. Moreover, FIG. 2 is a cross-sectional view taken along line A—A of FIG. 1. The semiconductor acceleration sensor 100 includes a substrate 1 serving as a sensor substrate, and a sensor part 3 which is formed above the substrate 1 (on the front side of the paper face of FIG. 1) and has a function of detecting acceleration.

The sensor part 3, which includes a movable mass body 21, a plurality of fixed structures 23 and a plurality of beams 25, is formed as a thin-film structural body. The thin-film structural body is formed by using a conductive material, that is, for example, doped polysilicon made by silicon doped with impurities such as phosphorous.

The mass body 21 has a plurality of movable electrode portions 21*a* that extend in direction C perpendicular to direction B of acceleration to be detected. Each of the fixed structures 23 includes a fixed electrode portion 23*a* extendedly formed in direction C, and a supporting portion 23*b* supporting the fixed electrode portion 23*a*. The fixed electrode portions 23*a* are provided with predetermined distance from each other in direction B. The fixed structures 23 are respectively connected to either of the wirings 43 and 45 through the supporting portions 23*b* thereof. However, the application of the present invention is not intended to be limited by which wiring 43 or 45 each fixed structure 23 is connected to.

As shown in FIG. 2, the fixed electrode portions 23*a* are placed with a predetermined distance from the substrate 1 to be floating. The supporting portion 23*b* is connected to the substrate 1, and more specifically to the wiring 45 at position A—A. In the same manner as the fixed electrode portions 23*a*, the movable electrode portions 21*a* are also placed with a predetermined distance from the substrate 1.

Each beam 25 is integrally formed with the mass body 21 so as to suspend the mass body 21 above the substrate 1. Each beam 25 includes a supporting portion 25*a* protruding upward from the substrate 1, a spring portion 25*c* provided on the end edge of the mass body 21 with respect to direction B, and a connecting portion 25*b* for connecting the supporting portion 25*a* and the spring portion 25*c*. The spring portion 25*c* is elastically bent and deformed, at least, along direction B. Thus, the mass body 21 is allowed to move along direction B while maintaining a restoring force. One end of the supporting portion 25*a* is connected to the wiring 41 therebelow.

The fixed electrode portions 23*a* and the movable electrode portions 21*a* are alternately placed with distances from each other in direction B. When acceleration is applied to the acceleration sensor 100 in direction B, the mass body 21 moves so that the distance between the movable electrode portion 21*a* and the fixed electrode portion 23*a* is changed. Therefore, the electrostatic capacity, formed by the movable electrode portion 21*a* and the fixed electrode portion 23*a*, is measured externally by using wirings 41, 43 and 45 so that it is possible to detect the applied acceleration.

As shown in FIG. 2, the substrate 1 includes a substrate main body 31, an oxide film 33, wirings 43 and 45, and a nitride film 47. Moreover, as shown in FIG. 1, the substrate 1 also includes a wiring 41. The oxide film 33 is provided on the substrate main body 31. The surface of the oxide film 33 is flat, and the wirings 41, 43 and 45 are formed on the oxide film 33. For example, the surface of the oxide film 33 and the surfaces of the wirings 41, 43 and 45 are set on the same plane.

The nitride film 47 covers the respective surfaces and side faces of the wirings 41, 43, 45 and the oxide film 33. Here, the nitride film 47 has hole sections 47$a$, 47$b$ and 47$c$, which respectively allow the surfaces of the wirings 41, 43 and 45 to expose selectively. FIG. 2 shows a state where the supporting portion 23$b$ is connected to the wiring 45 through the hole section 47$c$.

The edge 45$a$ of the surface of the wiring 45 defines the width of the surface in a direction (direction perpendicular to the paper face in FIG. 2) to which the wiring 45 is extended. The hole section 47$c$ enters the wiring 45 inward from the edge 45$a$ by a predetermined distance d2. In the same manner, the supporting portion 25$a$ and the supporting portion 23$b$ are respectively connected to the wirings 41 and 45 through the hole sections 47$a$ and 47$b$. Here, the wiring 41 is formed below the sensor part 3 so as to be widely exposed.

As described above, since the oxide film 33 and the nitride film 47 are different in the direction of residual stress thereof, a shearing stress is exerted between the two films. However, the hole section 47$c$ is formed at the edge of the nitride film 47, and located adjacent to the wiring 45 with a predetermined distance d1. Therefore, it is possible to suppress the generation of separation.

Moreover, as shown in FIG. 2, the supporting portion 23$b$ is desirably designed to cover the hole section 47$c$. More specifically, the supporting portion 23$b$ is provided so as to extend wider than the hole section 47$c$ by a predetermined distance d2. By connecting the supporting portion 23$b$ to both of the nitride film 47 and the wiring 45, it becomes possible to reduce the possibility of separation between the oxide film 33 on which the wiring 45 is provided and the nitride film 47. Moreover, the thick supporting portion 23$b$ makes it possible to improve the strength of the fixed structure 23.

FIGS. 3 to 9 are cross-sectional views showing a method for manufacturing a semiconductor acceleration sensor 101 in its sequence of processes, and each of the figures show a cross-section at a position taken along line A—A of FIG. 1.

Figure 3:
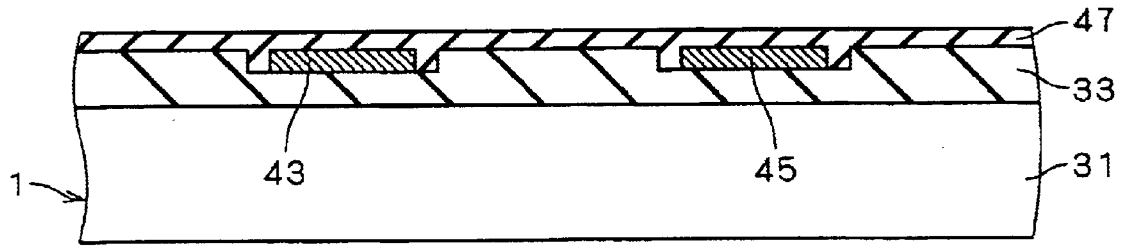

First, a substrate main body 31 is set, and an oxide film 33 is formed thereon. For example, the substrate main body 31 is made by silicon which is a semiconductor, and the oxide film 33 is formed by thermal oxidation of the substrate main body 31. The wirings 41, 43 and 45 are formed by, for example, the following steps. First, recessed sections are provided on the oxide film 33 at areas in which the wirings 41, 43 and 45 are to be formed. A conductive material having a thickness which approximately corresponds to the recessed section, for example, doped polysilicon, is deposited, and patterned with a width narrower than the width of the recessed section. After these processes, the residual doped polysilicon is allowed to form the wirings 41, 43 and 45, and these are selectively formed on the oxide film 33. Next, a nitride film 47 is formed on the oxide film 33 and the wirings 41, 43 and 45 so that a structure shown in FIG. 3 is obtained. Here, since no wiring 41 is located along the position A—A, no wiring 41 appears on FIGS. 3 to 8. The sacrifice film 51 is formed by using, for example, an oxide film, a PSG (phospho silicate glass) film or a BPSG (boro-phospho silicate glass) film.

Figure 4:
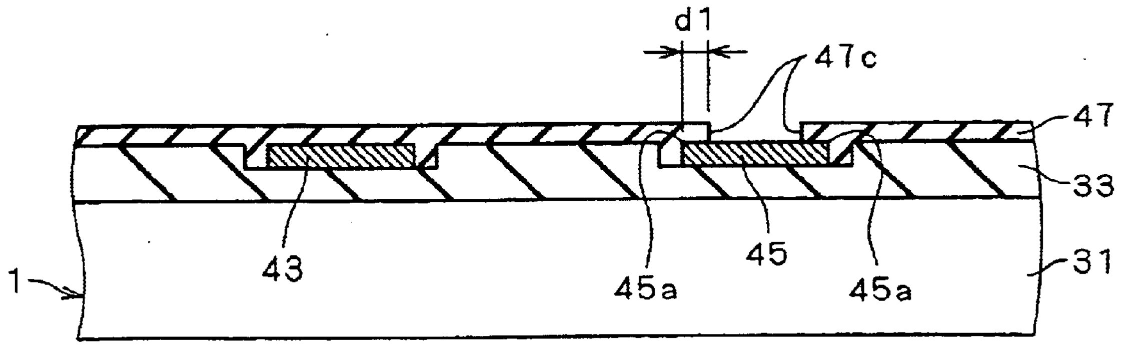

Next, the nitride film 47 is selectively removed by etching, and a hole section 47$c$ is formed in the nitride film 47 to obtain a structure shown in FIG. 4. The hole section 47$c$ is allowed to cover the edge 45$a$ of the surface of the wiring 45 with a predetermined distance d1. The hole sections 47$a$ and 47$b$ are formed in the same manner.

Figure 5:
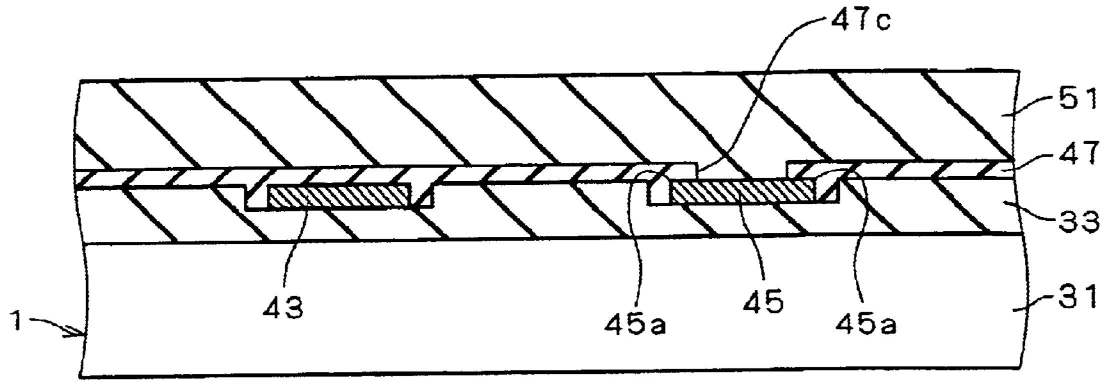

A sacrifice film 51 is formed on the surface of the wiring 45 exposed through the hole section 47$c$ and the nitride film 47 to obtain a structure shown in FIG. 5. The sacrifice film 51 is formed by using, for example, an oxide film, a PSG (phospho silicate glass) film or a BPSG (boro-phospho silicate glass) film.

Figure 6:
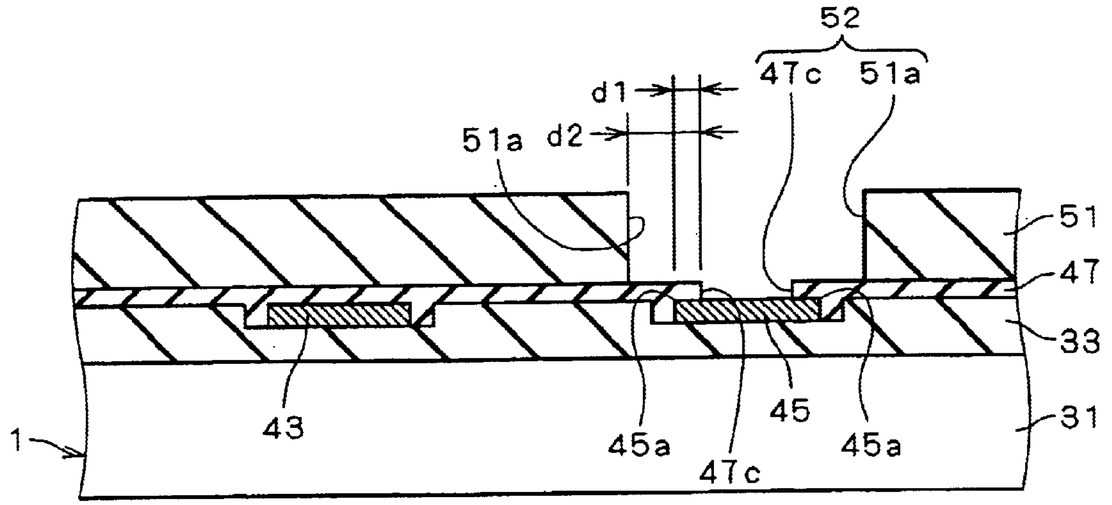

Next, at positions in which the supporting portions 25$a$ and 23$b$ are formed, an etching process is carried out on the sacrifice film 51 so that one portion thereof is selectively removed to form an opening 51$a$ through which the surface of the wiring 41, 43 and 45 is exposed (FIG. 6). Since the supporting portion 23$b$ to be connected to the wiring 45 is formed at the position A—A, a recessed section 51$a$ is formed not above the wiring 43, but above the wiring 45, in FIG. 6. The opening 51$a$ is opened so as to retreat from the hole section 47$c$ by a predetermined distance d2. With the hole section 47$c$, the opening 51$a$ forms the anchor hole 52 through which the wiring 45 is exposed. Anchor holes are also formed at hole sections 47$a$ and 47$b$ in the same manner.

A dry etching process can be employed for the etching of the sacrifice film 51. In this case, preferably, an isotropic etching process is adopted in parallel. As shown in FIG. 7, this process makes it possible to eliminate angulated corners on the opening side of the opening 51$a$. The advantages of this process will be described later.

FIG. 10 is a plan view taken from the opening side of the anchor hole 52, which shows the vicinity of the anchor hole 52 shown in FIG. 7.

Next, as shown in FIG. 8, a thin-film layer 53 is formed on the remaining sacrifice film 51 and the substrate 1 exposed through the anchor hole 52. For example, the film thickness of the thin film layer 53 is thicker than the film thickness of the sacrifice film 51. In this case, the anchor hole 52 is filled with the thin-film layer 53.

Then, as shown in FIG. 9, the thin-film layer 53 is selectively removed and patterned. Consequently, the mass body 21, the beams 25 and the fixed electrodes 23 are formed by the residual portions of the thin-film layer 53. In order to achieve the above-mentioned object, the thin-film layer 53 is formed by using a conductive material, for example, doped polysilicon. Referring to FIG. 8, the portion of the thin-film layer 53 fitted into the anchor hole 52 is allowed to form the supporting portion 23$b$, and the portion of the thin-film layer 53 located on the sacrifice film 51 is allowed to form the fixed electrode portion 23$a$. The supporting portion 25$a$, the mass body 21, the spring portion 25$c$ and the connecting portion 25$b$ are formed by the thin-film layer 53 in the same manner.

Thereafter, the sacrifice film 51 is removed to obtain a structure shown in FIG. 1 and FIG. 2. When the thin-film layer 53 is formed with the sacrifice film 51 being maintained in the form as shown in FIG. 6, the film thickness of the thin-film layer 53 becomes thinner in the vicinity of the opening 51$a$. Such thin portion is not desirable since it tends to cause insufficient strength in the fixed structure 23. Therefore, as shown in FIG. 7, it is preferable to eliminate the angulated corners on the opening side of the opening 51$a$, and consequently to prevent the generation of a thin portion in the film thickness upon forming the thin-film layer 53.

In the electrode structure shown in FIG. 9, since the hole section 47$c$ covers the wiring 45 with a predetermined distance d1 from the end edge 45$a$, it is possible to lengthen the invading path to the oxide film 33 of etchant to be used for the succeeding etching process of the sacrifice film 51. This makes it possible to reduce the possibility that the etchant reaches to the oxide film 33. In other words, even when the oxide film 33 and the sacrifice film 51 are made of the same silicon oxide film, it is possible to reduce the possibility that the oxide film 33 is etched in the etching process of the sacrifice film 51.

The hole section 47*c* is filled with the thin-film layer 53. Therefore, it is possible to more effectively prevent the etchant to be used for etching the sacrifice film 51 from invading the oxide film 33.

The opening 51*a* is opened so as to retreat from the hole section 47*c* by a predetermined distance d2 so that the opening 51*a* is also filled with the thin-film layer 53. In this manner, by filling the anchor hole 52 with the thin-film layer 53, it is possible to lengthen the invading path to the oxide film 33 of etchant to be used for the etching process of the sacrifice film 51. Moreover, the supporting portion 23*b* becomes thicker, thereby making it possible to increase the strength of the fixed structure 23.

B. Embodiment 2

Figure 11:
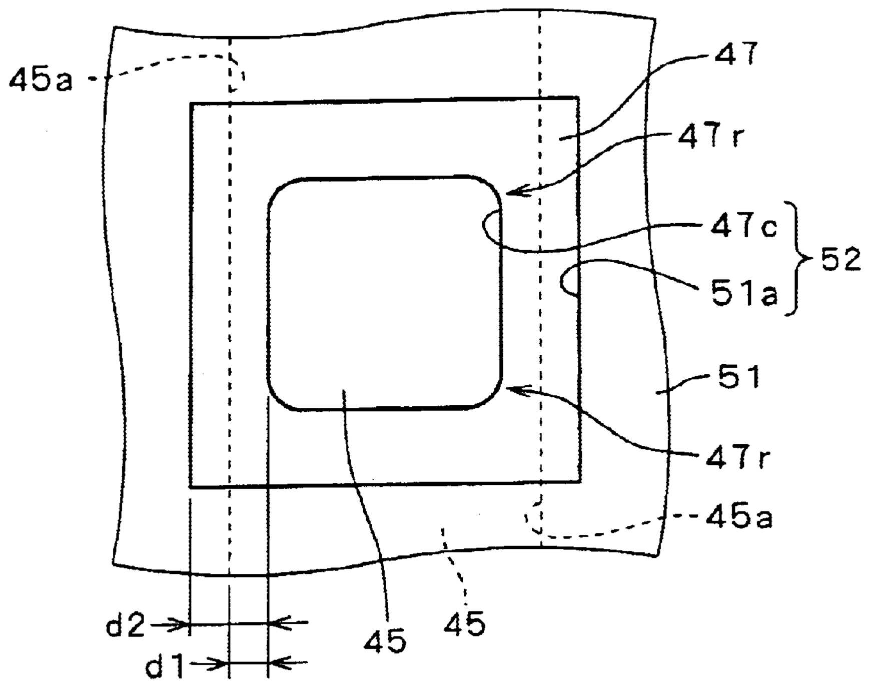

In the present embodiment, the following description will be given of desirable shapes of the hole section 47*c* and the opening 51*a* on plan views. FIG. 11 is a plan view showing one example. In the same manner as the structure shown in FIG. 10 in embodiment 1, the hole section 47*c* is provided so as to enter from the edge 45*a* by a predetermined distance d1, while the opening 51*a* is provided so as to retreat from the hole section 47*c* by a predetermined distance d2.

The present embodiment has a feature that although the hole section 47*c* has a substantially square shape in its plan view, the corners 47*r* thereof are rounded. A shearing stress, which is formed by a residual stress in the oxide film 33 and a residual stress of the nitride film 47, tends to concentrate on each of the corners of the hole section 47*c* opened in the nitride film 47. However, with the arrangement of the present embodiment in which the shape on the plan view of the hole section 47*c* is set to a polygonal shape with rounded corners, it becomes possible to alleviate concentration of the stress.

Figure 12:
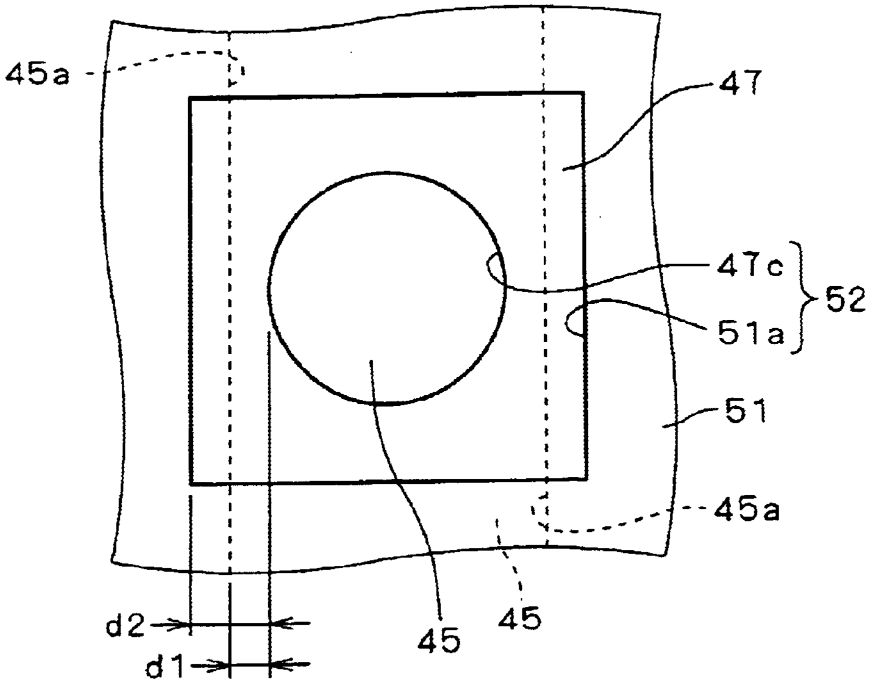
Figure 14:
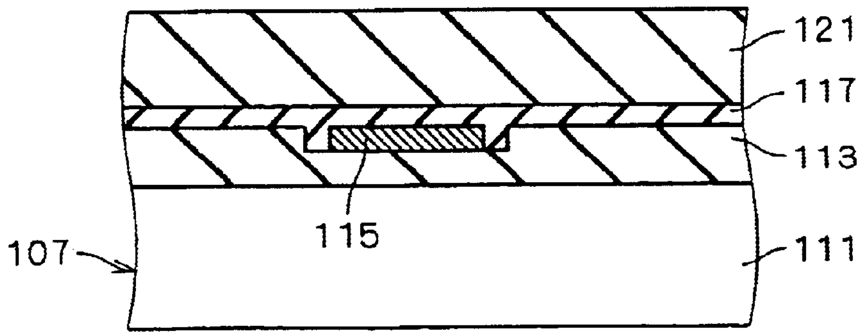
FIGS. 14 to 16 are cross-sectional views showing a sequence of conventional manufacturing processes of a thin-film structural body.
Figure 15:
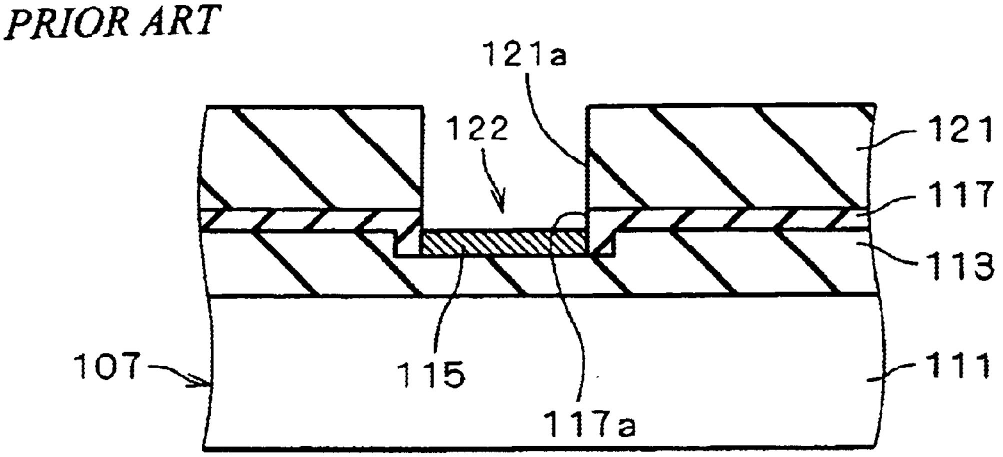
Figure 16:
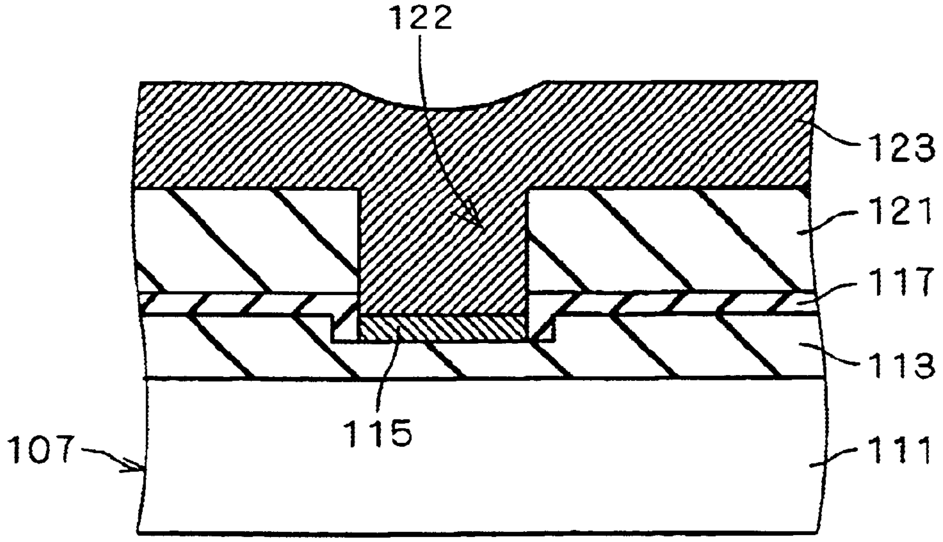

The shape of the hole section 47*c* on the plan view may be not only a square shape with rounded corners, but also a polygonal shape with rounded corners. The greater the number of rounded corners, the more the concentration of stress is alleviated. Alternatively, as shown in FIG. 12, the shape of the hole section 47*c* on the plan view may be given as an elliptic shape (including a circle). In this case, it is only necessary to set the outline of the hole section 47*c* closest to the edge 45*a* apart therefrom by a predetermined distance d1.

FIG. 13 is a plan view showing another example. In the same manner as the structure of embodiment 1 shown in FIG. 10, the hole section 47*c* is provided so as to enter from the edge 45*a* by a predetermined distance d1, and the opening 51*a* is provided so as to retreat from the hole section 47*c* by a predetermined distance d2.

However, in the structure shown in FIG. 13, although the opening 51*a* has a substantially square shape in its plan view, the corners 51*r* thereof are rounded. Thus, in this case also, it is possible to alleviate the concentration of stresses. FIG. 13 shows a state where not only the corners of the opening 51*a* but also the corners 47*r* of the hole section 47*c* are rounded; however, only the corners 51*r* of the opening 51*a* may be rounded. In the same manner as the hole section 47*c*, with respect to the shape on the plan view, not limited to a square shape with its corners being rounded, the opening 51*a* may also have either a polygonal shape with its corners being rounded, or an elliptical shape (including a circle).

In the above-mentioned first and second embodiments, the predetermined distance d2 is set to be greater than the predetermined distance d1 in the figures; however, even in the relationship of 0<d2 <d1, it is clear that the effects of the present invention are obtained.

While the present invention has been described in detail, the above description is illustrative in all aspects and the present invention is not restrictive thereto. It will be understood that numerous variants which are not illustrated can be supposed without departing from the scope of the invention.

What is claimed is:

1. An electrode structure comprising:

a wiring selectively placed on a first insulating film;

a second insulating film covering said first insulating film, selectively covering said wiring, and having a hole section, said hole section entering said wiring inward by a first predetermined distance from an edge of a surface of said wiring to selectively expose said surface of said wiring;

a sacrifice film having an opening selectively exposing said surface of said wiring, and selectively formed on at least said second insulating film; and a thin-film layer made of a doped polysilicon and connected to said surface of said wiring selectively exposed through said opening and said hole section.

2. The electrode structure according to claim 1, wherein said hole section is filled with said thin-film layer.

3. The electrode structure according to claim 2, wherein said opening is opened so as to retreat from said hole section by a second predetermined distance.

4. The electrode structure according to claim 3, wherein said opening is filled with said thin-film layer.

5. The electrode structure according to claim 1, wherein said hole section has a polygonal shape with rounded corners or an 25 elliptic shape on a plan view.

6. The electrode structure according to claim 1, wherein said opening has a polygonal shape with rounded corners or an elliptic shape on a plan view.

7. The electrode structure according to claim 1, wherein a surface of said first insulating film and said surface of said wiring are placed on a same plane.

8. An electrode structure comprising:

a wiring selectively placed on a first insulating film;

a second insulating film covering said first insulating film, selectively covering said wiring, and having a hole section, said hole section entering said wiring inward by a first predetermined distance from an edge of a surface of said wiring to selectively expose said surface of said wiring, a residual stress of the second insulating film is different from a residual stress of said first insulating film;

a sacrifice film having an opening selectively exposing said surface of said wiring, and selectively formed on at least said second insulating film; and a conductive thin-film structural body comprising a doped polysilicon and having a supporting portion connected to the surface of said wiring selectively exposed through said hole section, and a floating portion supported by said supporting portion with a predetermined distance from said second insulating film.

9. The electrode structure according to claim 8, wherein said supporting portion covers said hole section.

10. The electrode structure according to claim 8, wherein said residual stress of said first insulating film is a compressive stress while said residual stress of said second insulating film is a tensile stress.

11. The electrode structure according to claim 10, wherein said first insulating film is an oxide film, and said second insulating film is a nitride film.

12. The electrode structure according to claim 8, wherein a surface of said first insulating film and said surface of said wiring are placed on a same plane.

13. The electrode structure according to claim 8, wherein said hole section has a polygonal shape with rounded corners or an elliptic shape on a plan view.

14. The electrode structure according to claim 8, wherein said opening has a polygonal shape with rounded corners or an elliptic shape on a plan view.

15. A manufacturing method of a thin-film structural body, comprising the steps of:

(a) selectively forming a wiring on a first insulating film;

(b) forming a second insulating film on said wiring and said first insulating film;

(c) selectively removing said second insulating film to form a hole section which enters said wiring inward from an edge of a surface of said wiring by a first predetermined distance so that said surface of said wiring is selectively exposed;

(d) forming a sacrifice film on said second insulating film;

(e) selectively removing said sacrifice film to form an opening exposing said surface of said wiring so that an anchor hole is formed;

(f) forming a thin-film layer on said anchor hole and said sacrifice film with a doped polysilicon; and (g) removing said sacrifice film by etching.

16. The manufacturing method of a thin-film structural body according to claim 15, wherein said opening is opened so as to retreat from said hole section by a second predetermined distance.

17. The electrode structure according to claim 15, wherein said hole section has a polygonal shape with rounded corners or an elliptic shape on a plan view.

18. The electrode structure according to claim 15, wherein said opening has a polygonal shape with rounded corners or an elliptic shape on a plan view.

19. The manufacturing method of a thin-film structural body according to claim 15, wherein said first insulating film and said sacrifice film are oxide films, and said second insulating film is a nitride film.

20. The manufacturing method of a thin-film structural body according to claim 15, wherein a surface of said first insulating film and said surface of said wiring are placed on a same plane.

* * * * *